United States Patent
Nishijima

(10) Patent No.: US 8,058,586 B2
(45) Date of Patent: Nov. 15, 2011

(54) PLASMA TREATMENT APPARATUS AND PLASMA TREATMENT METHOD

(75) Inventor: Tatsumi Nishijima, Chino (JP)

(73) Assignee: Seiko Epson Corporation, Tokyo (JP)

( * ) Notice: Subject to any disclaimer, the term of this patent is extended or adjusted under 35 U.S.C. 154(b) by 1099 days.

(21) Appl. No.: 11/853,703

(22) Filed: Sep. 11, 2007

(65) Prior Publication Data

US 2008/0061041 A1    Mar. 13, 2008

(30) Foreign Application Priority Data

Sep. 12, 2006    (JP) ................................ 2006-246972

(51) Int. Cl.
    *B23K 10/00*      (2006.01)

(52) U.S. Cl. ......... 219/121.48; 219/121.58; 219/121.52; 118/723 I; 156/345.34; 156/345.51

(58) Field of Classification Search ............. 219/121.48, 219/121.58, 121.4, 121.41, 121.43, 121.44; 118/723 I, 723 R; 156/345.34, 345.47, 345.51, 156/345.52

See application file for complete search history.

(56) References Cited

FOREIGN PATENT DOCUMENTS

| JP | 06-244175 | 9/1994 |
|----|-----------|--------|
| JP | 07-211769 | 8/1995 |
| JP | 2004-158563 | 6/2004 |
| KR | 2002-0033441 A | 5/2002 |

OTHER PUBLICATIONS

Taiwanese IPO; Office Action in foreign application (TW 094124985) to which priority is claimed by the present application; Aug. 8, 2008.

*Primary Examiner* — Mark Paschall

(57) ABSTRACT

A plasma treatment apparatus that can perform an excellent plasma treatment on a portion of a work which is to be used for producing products or parts, while preventing undesirable occurrence of discharge at that portion reliably is provided. The plasma treatment apparatus performs a plasma treatment on a plate-shaped work having an usable region to be used for producing products or parts and an unusable region other than the usable region. The plasma treatment apparatus includes a first electrode, a second electrode provided so as to face the first electrode via the work so that a space is formed between the second electrode and the work, a gas supply unit which supplies a gas into the space, a power circuit having a power source which applies a high frequency voltage across the first and second electrodes so that the gas supplied into the space is converted into a plasma, and a support unit which supports at least a part of the second region of the work so that the work is spaced apart from the first electrode in a distance at which discharge does not occur between the first region and the first electrode when the high frequency voltage is applied across the first and second electrodes. A plasma treatment method performed using such a plasma treatment apparatus is also provided.

14 Claims, 3 Drawing Sheets

Cross sectional view taken along line A-A in Fig. 2A

Enlarged sectional view of portion B in Fig. 2B

PLASMA TREATMENT APPARATUS AND PLASMA TREATMENT METHOD

CROSS-REFERENCE TO RELATED APPLICATION

This application claims a priority to Japanese Patent Application No. 2006-246972 filed on Sep. 12, 2006 which is hereby expressly incorporated by reference herein in its entirety.

BACKGROUND

1. Technical Field

The present invention relates to a plasma treatment apparatus and a plasma treatment method.

2. Related Art

Conventionally, there is known a plasma treatment apparatus which performs a plasma treatment on a surface of a work (See, for example, JP-A-6-244175 and JP-A-7-211769). FIG. 3 is a vertical sectional view which schematically shows a configuration of a conventional plasma treatment apparatus.

Specifically, the plasma treatment apparatus 100 shown in FIG. 3 includes a stage (first electrode) 120 provided with an electrostatic chuck (electrostatic absorption unit) 125 for holding a wafer (work) 110, an electrode 130 for generating plasma (second electrode) arranged to face the first electrode 120 via the wafer 110, a gas supply unit 140 for supplying a gas between the wafer 110 and the second electrode 130, a high frequency power source 150 for applying a high frequency voltage across the first electrode 120 and the second electrode 130, and a chamber 160 in which the wafer 110, the first electrode 120 and the second electrode 130 are housed (See, for example, JP-A-7-211769).

In such a plasma treatment apparatus 100, when a high frequency voltage is applied across the first electrode 120 and the second electrode 130 while supplying a particular gas between the wafer 110 and the second electrode 130, the gas is converted into a plasma. As a result, the plasma treatment is performed on the wafer 110 due to the action of an activate atom or activate molecule contained in the thus generated plasma.

However, in the plasma treatment apparatus 100, in the case where a space is formed between the wafer 110 mounted on the first electrode 120 and the first electrode 120, the following defect occurs. Specifically, if a distance of the formed space between two objects (the wafer 110 and the first electrode 120) is too small, discharge readily occurs between the two objects.

Therefore, in the case where only a small warpage is present in the wafer 110, a space is formed between the wafer 110 and the first electrode 120 due to the warpage of the wafer 110. As a result, discharge readily occurs between the wafer 110 and the first electrode 120 due to the existence of the space. Especially, in the case of a wafer 110 made of a metallic material and having too thin thickness, warpage is easily to occur, the above mentioned tendency becomes noticeable.

When discharge occurs between the wafer 110 and the first electrode 120, there is a case that a portion of the wafer 110 at which the discharge occurs is degenerated or deteriorated. In the case where the degenerated or deteriorated portion of the wafer 110 is used for producing products or parts, the products or parts become defective goods.

SUMMARY

Accordingly, it is an object of the present invention to provide a plasma treatment apparatus that can perform an excellent plasma treatment on a portion of a work which is to be used for producing products or parts, while preventing undesirable occurrence of discharge at that portion reliably. Further, it is also an object of the present invention to provide a plasma treatment method performed using such a plasma treatment apparatus.

In order to achieve the object, a first aspect of the invention is directed to a plasma treatment apparatus. The plasma treatment apparatus performs a plasma treatment on a plate-shaped work having a first region to be subjected to the plasma treatment to produce products or parts and a second region other than the first region.

The plasma treatment apparatus comprises a first electrode, a second electrode provided so as to face the first electrode via the work so that a space is formed between the second electrode and the work, a gas supply unit which supplies a gas into the space, a power circuit having a power source which applies a high frequency voltage across the first and second electrodes so that the gas supplied into the space is converted into a plasma, and a support unit which supports at least a part of the second region of the work so that the work is spaced apart from the first electrode in a distance at which discharge does not occur between the first region and the first electrode when the high frequency voltage is applied across the first and second electrodes.

According to the invention mentioned above, it is possible to provide a plasma treatment apparatus that can perform an excellent plasma treatment on a portion (region) of a work which is to be used for producing products or parts, while preventing undesirable occurrence of discharge at that portion reliably.

In the above plasma treatment apparatus, it is preferred that the work has a first electrode side surface at the side of the first electrode and a second electrode side surface which is opposite from the first electrode side surface, and the support unit supports almost all of the first electrode side surface corresponding to the second region.

This also makes it possible to reliably support a work having a thin thickness and a relatively low mechanical strength by the support unit. As a result, it is possible to perform the plasma treatment on such a work.

In the above plasma treatment apparatus, it is preferred that the support unit is electrically connected to the first electrode.

This makes it possible for the support unit to have a ground potential. As a result, it becomes difficult for the support unit to be electrostatically charged. Therefore, it is possible to prevent a behavior of the plasma from being influenced by the charged support unit. This makes it possible to perform a more uniform and excellent plasma treatment on the work.

In the above plasma treatment apparatus, it is preferred that the work has a peripheral portion where the second region is provided, and the support unit includes a frame member having a concave portion for receiving the peripheral portion of the work.

This makes it possible to ensure a sufficient distance between the work (first region) and the first electrode. As a result, an excellent plasma treatment can be performed on the first region inside the peripheral portion (second region) of the work. Further, even if warpage is present in the work, occurrence of discharge at the first region of the work 10 is prevented reliably.

Further, this also makes it possible to convey the work together with the frame member without touching the work directly. Therefore, it is possible to convey the work easily, while preventing contamination or breakage of the work due to direct contact with an object other than the frame member or an operator who handles the work.

Furthermore, the frame member can hold the work reliably by receiving the peripheral portion of the work in the concave portion. Therefore, even in the case where vibration is given to the frame member during the work being automatically conveyed, it becomes difficult for the work to drop therefrom. This helps to convey the work at a high-speed. In addition, positional accuracy of the work with respect to the first electrode can be improved.

In the above plasma treatment apparatus, it is preferred that the frame member has conductivity.

This makes it possible to electrically connect the work to the frame member reliably. As a result, since potential difference between the work and the frame member is decreased, it is possible to suppress discharge from occurring therebetween.

In the above plasma treatment apparatus, it is preferred that the frame member is formed of a metal-based material.

Since a metal-based material has relatively excellent conductivity, by using the metal-based material as a constituent material of the frame member, conductivity of the frame member can be improved. This makes it possible to electrically connect the work to the frame member reliably. As a result, since potential difference between the work and the frame member is decreased, it is possible to suppress discharge from occurring therebetween.

Further, by using such a metal-based material, a mechanical strength of the frame member can be increased. This makes it possible to make a size of the frame member small and reduce a weight of the frame member. Furthermore, since many metal-based materials generally have high durability against various kinds of plasma treatments, degradation of the frame member can be prevented even if it is used for a long time.

In the above plasma treatment apparatus, it is preferred that the support unit includes a leg portion which supports the frame member so that the frame member is spaced apart from the first electrode.

This makes it possible to ensure a sufficient distance between the work and the first electrode. Further, this also makes it possible to use a thin frame member. As a result, a weight of the frame member can be reduced. The reduction of the weight makes it possible to easily convey the frame member by a conveyance unit.

In the above plasma treatment apparatus, it is preferred that the leg portion is provided for adjusting the distance between the first region of the work and the first electrode by changing a distance between the frame member and the first electrode.

This makes it possible to adjust the distance between the first region of work and the first electrode arbitrarily. The arbitrary adjustment of the distance makes it possible to set the work at an optimum position, depending on conditions and purposes of the plasma treatment.

In the above plasma treatment apparatus, it is preferred that the distance between the first region of the work and the first electrode is in the range of 10 to 100 mm.

This makes it possible to prevent occurrence of discharge between the first region of the work and the first electrode reliably while preventing the size of the plasma treatment apparatus from being increased.

In the above plasma treatment apparatus, it is preferred that the average thickness of the work is in the range of 0.01 to 2 mm.

In the case of a thin work having a thickness of the above range, warpage is easily to occur. However, according to the plasma treatment apparatus, such a work can be also subjected to the plasma treatment effectively.

In the above plasma treatment apparatus, it is preferred that the first electrode has a size larger than that of the first region of the work and is arranged so as to cover completely the first region when viewed from the first electrode.

This makes it possible to apply uniform electric field strength to the entire of the work. As a result, the entire of the work (especially, first region) is subjected to the plasma treatment uniformly.

It is preferred that the above plasma treatment apparatus further comprises a chamber in which the work, the first electrode and the second electrode are housed, and the plasma treatment apparatus further comprises an evacuation unit which evacuates gas inside the chamber.

This makes it possible to prevent the work from making contact with the atmosphere (air). Therefore, it is possible to prevent contamination or oxidation of the work due to the contact with the atmosphere, and also to effectively remove reaction products generated during the plasma treatment from the inside of the chamber.

A second aspect of the invention is directed to a plasma treatment method for performing a plasma treatment on a work using the above plasma treatment apparatus.

The plasma treatment method comprises supporting the work by the support unit, placing the work supported by the support unit between the first and second electrodes, supplying the gas into the space between the second electrode and the work by means of the gas supply unit, converting the gas into the plasma by applying the high frequency voltage across the first and second electrodes by means of the power circuit, and performing the plasma treatment on at least a second electrode side surface of the work corresponding to the first region using the converted plasma.

This makes it possible to perform an excellent plasma treatment on a portion of a work which is to be used for producing products or parts, while preventing undesirable occurrence of discharge at that portion reliably.

DESCRIPTION OF EXEMPLARY EMBODIMENTS

Hereinafter, a plasma treatment apparatus and plasma treatment method in accordance with the invention will be described in detail based on preferred embodiments shown in the accompanying drawings.

First, an embodiment of a plasma treatment apparatus in accordance with the invention will be described.

Figure 1:
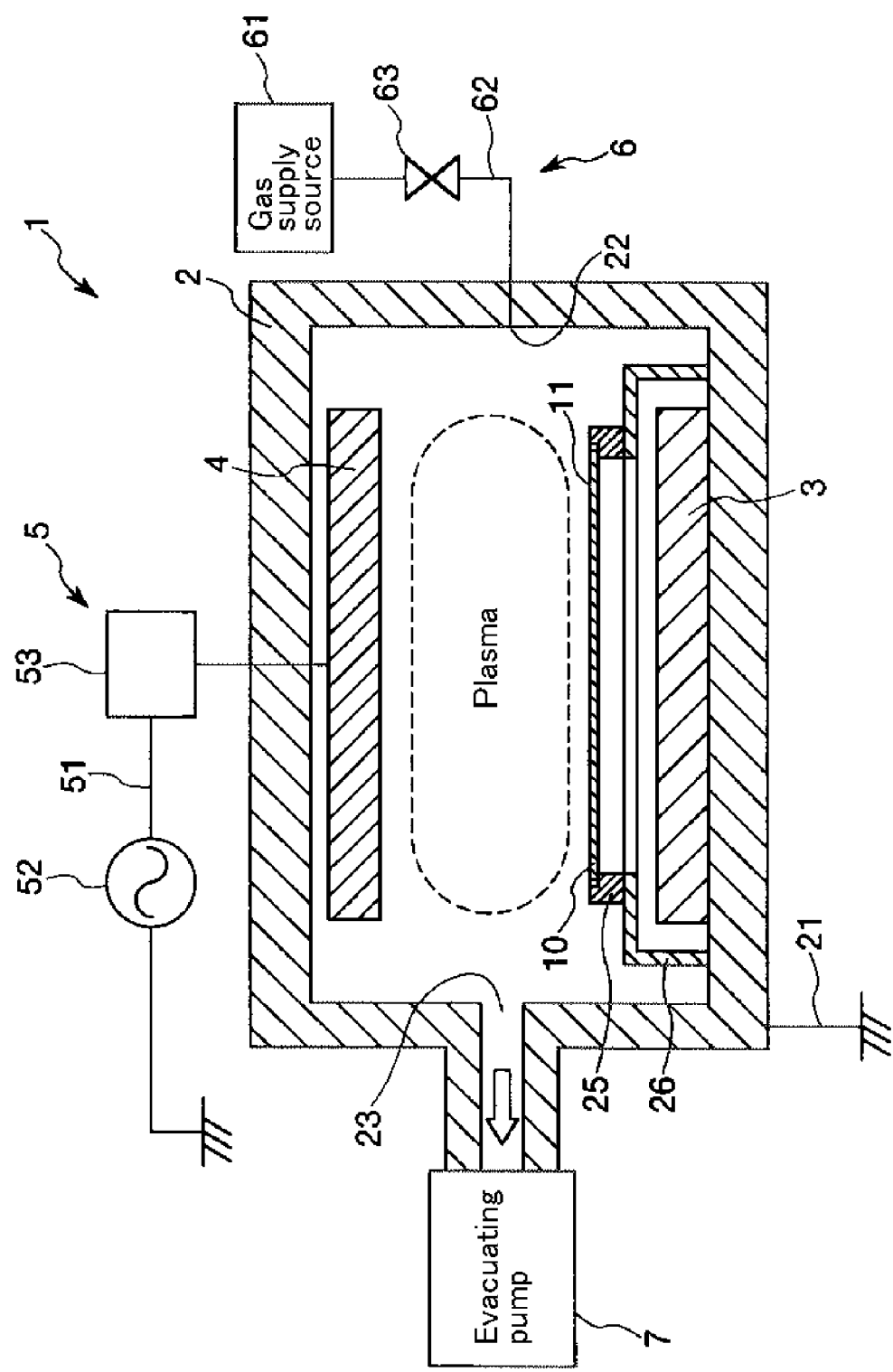
FIG. 1 is a vertical sectional view which schematically shows an embodiment of a plasma treatment apparatus in accordance with the invention.
Figure 2A:
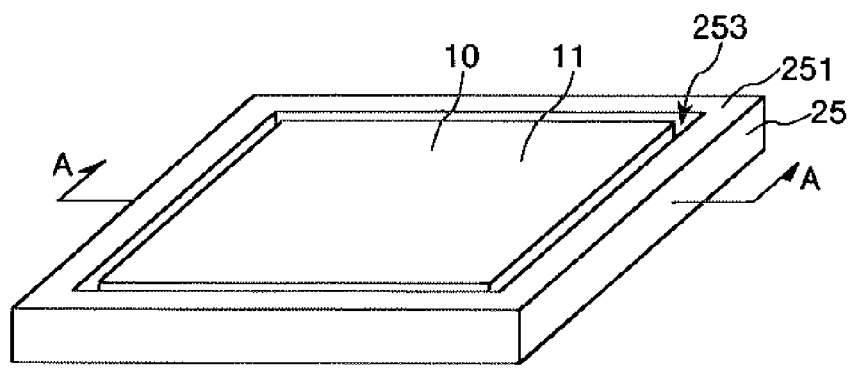
FIG. 2A is a perspective view of a frame member supporting a work.
Figure 2B:
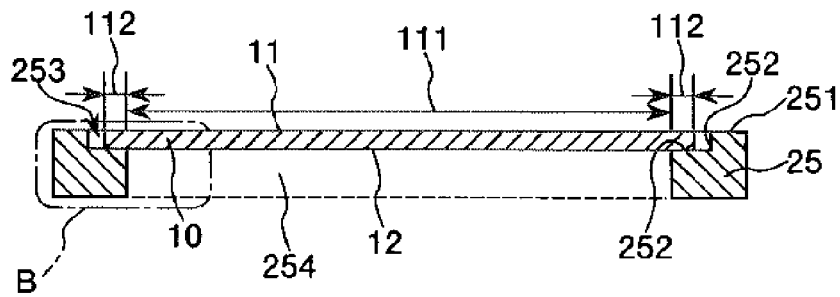
FIG. 2B is a cross sectional view taken along a line A-A in FIG. 2A.
Figure 2C:
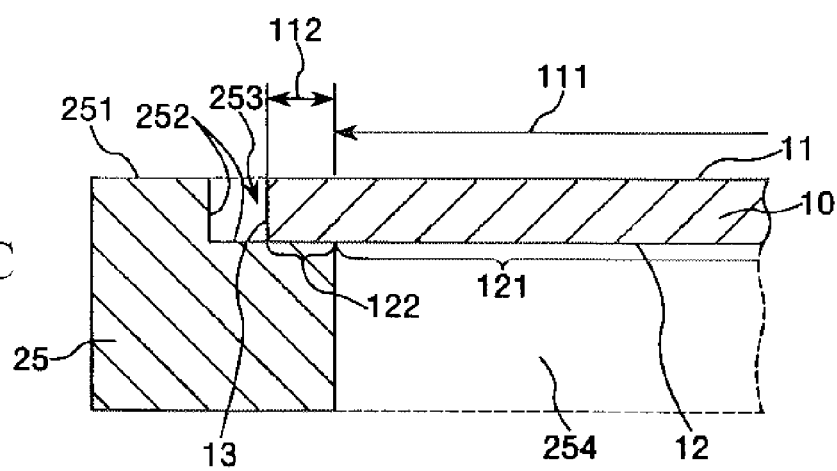
FIG. 2C is an enlarged sectional view of a portion B in FIG. 2B.

FIG. 1 is a vertical sectional view which schematically shows an embodiment of a plasma treatment apparatus in accordance with the invention. FIG. 2A is a perspective view of a frame member supporting a work, FIG. 2B is a cross sectional view taken along a line A-A in FIG. 2A, and FIG. 2C is an enlarged sectional view of a portion B in FIG. 2B.

In this regard, it is to be noted that in the following description, the upper side in FIG. 1, FIG. 2B and FIG. 2C will be referred to as "top" or "upper" and the lower side will be referred to as "bottom" or "lower", only for the sake of better understanding.

The plasma treatment apparatus 1 shown in FIG. 1 is an apparatus that performs various kinds of plasma treatments such as a film forming treatment, an etching process, an ashing treatment, a hydrophilic treatment, and a hydrophobic treatment on a work 10.

This plasma treatment apparatus 1 includes a chamber 2 in which the work 10 is to be placed, a first electrode 3, a second electrode 4 provided so as to face the first electrode 3 via the work 10, a power circuit 5 which applies a high frequency voltage across the first and second electrodes 3 and 4, a gas supply unit (gas supply means) 6 which supplies a gas into the chamber 2, an evacuating pump (evacuating unit or evacuating means) 7 which evacuates gas inside the chamber 2.

Among these components, the first electrode 3 and the second electrode 4 are provided inside the chamber 2. Hereinafter, description will be given to the configuration of individual components.

Now, description will be given to the work 10 prior to the description of the plasma treatment apparatus 1. The work 10 has a top surface 11 facing the second electrode 4 (hereinafter, it will be also referred to as "treatment surface").

In this embodiment, a predetermined region of the top surface 11 is subjected to the above mentioned plasma treatment using the plasma treatment apparatus 1 (hereinafter, it will be also referred to as "treatment region").

Examples of a material that can be used for constituting the work 10 include various kinds of silicon-based materials such as Si, $SiO_2$, SiN and $Si_3N_4$, various kinds of metal-based materials such as Al, Au, Cr, Cu, Ga, Fe, Mo, Nb, Ni, Ta, Ti, V, W and an alloy containing at least one of these metals, various kinds of organic-based materials such as polyolefin and polyimide, various kinds of glass materials such as quartz glass and borosilicate glass, C, GaAs, and various kinds of composite materials each containing at least two of the above materials.

The work 10 is formed of a plate-shaped member having a shape such as rectangle, square, circle or oval when viewed from plane thereof, although the shape of the work 10 is not particularly limited thereto. In this embodiment, the work 10 is formed of a plate-shaped member having a square-shape when viewed from a top thereof.

The chamber 2 is a container which can maintain inner airtightness thereof. Since the chamber 2 is used in a state that the inside of the chamber 2 is decompressed or vacuumed, it is preferred that the chamber 2 has pressure tightness capable of withstanding a differential pressure between an inside pressure and an outside pressure.

Examples of a material that can be used for constituting such a chamber 2 include various kinds of metallic materials such as aluminum and stainless steel, various kinds of ceramics materials such as alumina.

In the chamber 2, a gas supply port 22 is provided in a right side wall thereof and an evacuating port 23 is provided in a left side wall thereof, respectively. The gas supply unit 6 is connected to the gas supply port 22 and the evacuating pump 7 is connected to the evacuating port 23.

In this embodiment, the chamber 2 is formed of a metallic material having high conductivity, and it is electrically grounded via a grounding conductor 21.

In the chamber 2, the first electrode 3 is provided on a bottom surface thereof. The first electrode 3 is of a plate-like shape and electrically connected to the chamber 2.

Further, the first electrode 3 has a size larger than that of an usable region of the work 10 described below (in this embodiment, the top surface 11 of the work 10) and is arranged so as to cover completely the usable region when viewed from the first electrode 3. This makes it possible to apply uniform electric field strength to the entire of the top surface 11 of the work 10. As a result, the entire of the work 10 (especially, usable portion) is subjected to the plasma treatment uniformly.

The second electrode 4 is provided inside the chamber 2 in a state that the second electrode 4 is electrically isolated from a top surface (ceiling plane) of the chamber 2. That is, the second electrode 4 is insulated from the chamber 2. The second electrode 4 is of a plate-like shape, and it is provided so as to face the first electrode 3 via the work 10.

A power source 52 is connected to this second electrode 4 via a wiring 51. Further, a matching box (matching unit) 53 is provided in a middle portion of the wiring 51. The power circuit 5 is configured from the wiring 51, the power source 52 and the matching box 53.

Since the first electrode 3 is grounded, by using such a power circuit 5, a high frequency voltage is applied across the first electrode 3 and the second electrode 4. This makes it possible to generate an electric field which alters its direction with high frequency in a space between the first electrode 3 and the second electrode 4.

The frequency of the high frequency is preferably in the range of about 1 kHz to 100 MHz and more preferably in the range of 10 to 60 MHz, although not particularly limited thereto. Further, the power density of the high frequency is preferably in the range of about 0.01 to 10 $W/cm^2$ and more preferably in the range of 0.1 to 2.5 $W/cm^2$, although not particularly limited thereto.

The gas supply unit 6 supplies a particular gas into the chamber 2. The gas supply unit 6 shown in FIG. 1 includes a gas supply source 61 in which the gas is generated or stored, a piping 62 which connects the supply source 61 to the gas supply port 22, and a flow controller 63 which is provided in a middle portion of the piping 62 for adjusting a flow rate of the gas flowing into the piping 62.

The gas supplied by the gas supply unit 6 is converted into a plasma by ionizing a gas molecule contained in the gas due to the action of the high frequency voltage (electric field). Examples of such a gas include a mixture gas containing a carrier gas and a treatment gas.

Examples of the carrier gas include noble gases such as He gas and Ar gas, and $H_2$ gas. On the other hand, the treatment gas is selected depending on the kinds of the plasma treatments performed on the work 10.

Specifically, in the case where the work 10 is subjected to the film forming treatment, examples of the treatment gas include fluorine-based gases such as $CHF_3$, $C_2F_4$, $C_2F_6$ and $C_4F_8$, silane-based gases such as $SiH_4$, $SiH_2Cl_2$ and $SiCl_4$, and metal halide gases such as $AlCl_4$ and $WF_6$.

Further, in the case where the work 10 is subjected to the etching process, the treatment gas is selected depending on a material constituting the work 10. Specifically, if the constituent material of the work 10 is the above mentioned silicon-based materials, glass materials or metal-based materials, examples of the treatment gas include a gas containing at least one of halogen-based gases such as $CF_4$, $C_2F_6$, $SF_6$, $Cl_2$, $BCl_3$, $CCl_4$, $SiCl_4$ and HBr.

On the other hand, in the case where the constituent material of the work 10 is the above mentioned organic-based materials or the work 10 is subjected to the ashing treatment, examples of the treatment gas include a gas containing at least one of oxygen-based gases such as $O_2$.

Further, in the case where the top surface (treatment surface) 11 of the work 10 is subjected to the hydrophilic treatment a gas containing $O_3$ or $H_2O$ can be used as the treatment gas. Furthermore, in the case where the top surface 11 of the work 10 is subjected to the hydrophobic treatment a gas containing at least one of the above mentioned fluorine-based gases can be used as the treatment gas.

The evacuating pump 7 evacuates gas inside the chamber 2. Further, the evacuating pump 7 may be constructed from an oil sealed rotary pump, a turbo molecular pump, or the like. Thus, the inside of the chamber 2 is decompressed by evacuating the gas inside the chamber 2. This makes it possible to convert the gas supplied from the gas supply unit 6 into a plasma easily.

Further, since it is possible to prevent the work 10 from making contact with the atmosphere (air), contamination or oxidation of the work 10 due to the contact with the atmosphere is prevented. Furthermore, it is possible to effectively remove reaction products generated during the plasma treatment from the inside of the chamber 2.

In this regard, it is to be noted that the pressure of the inside of the chamber 2 is properly adjusted depending on operation conditions. Specifically, when the gas supply unit 6 is not operated, that is, the gas containing the treatment gas is not supplied into the chamber 2 by the gas supply unit 6, the pressure of the inside of the chamber 2 is preferably set to 1 Pa or lower and more preferably set to about 0.001 to 0.3 Pa.

By setting the pressure of the inside of the chamber 2 to the above range, it is possible to make a condition which residual gas does not substantially exist within the chamber 2. This makes it possible to prevent occurrence of an adverse affect against the work 10 due to the existence of the residual gas.

In this regard, the pressure of the inside of the chamber 2 may be set to a value lower than the lower limit value, but in this case, it is necessary to use an expensive evacuating pump 7 having higher pumping speed.

The gas supplied into the chamber 2 by the gas supply unit 6 is diffused within the chamber 2. In this state, when a high frequency voltage is applied across the first electrode 3 and the second electrode 4, a molecule contained in the gas is ionized to thereby convert the gas into a plasma. As a result, the wafer 10 can be subjected to the above mentioned plasma treatment due to the action of the plasma.

In the meantime, a region of the work 10 subjected to the plasma treatment by means of the plasma treatment apparatus 1 is generally used for producing products or parts, whereas a remainder (in general, a peripheral portion) of the work 10 is used to a portion of the products or parts which does not require qualities, or treated as a waste or recyclable raw material.

In this embodiment, a peripheral portion of the work 10 corresponds to the remainder (that is, an unusable region (second region) which is not used for producing products or parts), whereas a region inside the peripheral portion of the work 10 corresponds to an usable region (first region) which is used for producing the products or parts. In this regard, it is to be noted that the usable region of the work 10 is not limited to a region shown in FIG. 2B.

Further, the work 10 has a top surface (second electrode side surface) 11 which is the side of the work 10 facing the second electrode 4, and a bottom surface (first electrode side surface) 12 which is opposite from the top surface 11 and the side of the work 10 facing the first electrode 3.

Hereinafter, a region of the top surface 11 corresponding to the usable region of the work 10 will be referred to as "region 111" and a region of the top surface 11 corresponding to the unusable region of the work 10 will be referred to as "region 112". In this regard, in this embodiment, the region 111 is mainly subjected to the plasma treatment, that is, the region 111 constitutes the treatment region.

Whereas, a region of the bottom surface 12 corresponding to the usable region of the work 10 will be referred to as "region 121" and a region of the bottom surface 12 corresponding to the unusable region of the work 10 will be referred to as "region 122".

Figure 3:
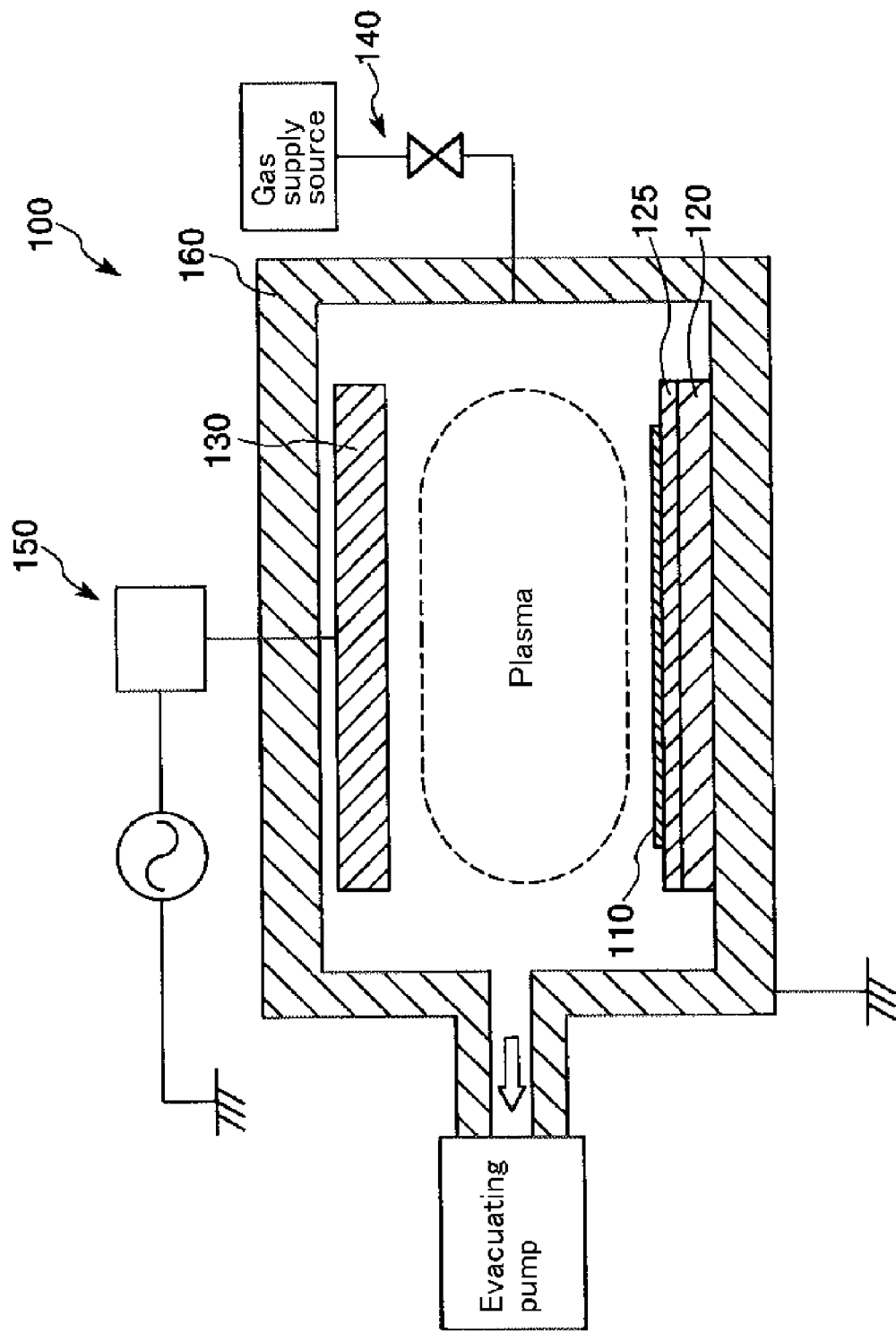
FIG. 3 is a vertical sectional view which schematically shows a configuration of a conventional plasma treatment apparatus.

As described above with reference to the prior art, the conventional plasma treatment apparatus shown in FIG. 3 includes the stage (first electrode) 120 provided with the electrostatic chuck (electrostatic absorption unit) 125 for holding a wafer (work) 110.

In this regard, it is to be noted that in the following description, the upper side in FIG. 3 will be referred to as "top" or "upper" and the lower side will be referred to as "bottom" or "lower", only for the sake of better understanding.

The stage (first electrode) 120 supports the entire of the bottom surface of the wafer 110 on the top surface thereof. In this regard, in the case where a slight space is formed between the wafer 110 and the stage 120, discharge readily occurs in the space.

Generally, in the case where a space (that is, distance) formed between two objects is too small, even if there is a slight potential difference therebetween, an electric field having a larger strength is generated in the space. Therefore, the smaller the space between the two objects causes, the more readily discharge occurs between the two objects.

If discharge occurs between the wafer 110 and the stage 120, a region of the wafer 110 at which the discharge occurs is degenerated or deteriorated. Further, in this case, there is a fear that the power circuit including the stage 120 and the power source 150 is damaged.

Especially, in the case where warpage is present in the wafer 110 itself, a fine space between the wafer 110 and the stage 120 is likely to be formed. As a result, discharge is highly likely to occur between a warp region of the wafer 110 and the stage 120.

Further, since the electrostatic chuck 125 for holding the wafer 110 is a high-price device, the plasma treatment apparatus 100 also becomes high-price. Moreover, since use of the electrostatic chuck 125 requires a considerably long time for absorbing and holding the wafer 110 and for releasing it, a treatment efficiency of the wafer 110 by the plasma treatment is lowered.

Consequently, in the plasma treatment apparatus 1 shown in FIG. 1 (that is, the plasma treatment apparatus of the invention), a frame member (tray) 25 is provided between the first electrode 3 and the second electrode 4. This makes it possible to maintain the work 10 in a state that the work 10 is spaced apart from the first electrode 3.

As shown in FIG. 2A to FIG. 2C, the frame member 25 is formed from a plate-shaped member having an opening 254 at a middle portion thereof. Namely, the frame member 25 is formed into a roughly square-shaped frame having the opening 254.

Further, the frame member 25 has a step 252 which is formed around the opening 254 at the side of the top surface 251 thereof. This step 252 defines a concave portion (mounting portion) 253 in which the peripheral portion of the work 10 where the unusable region (second region) is provided can be received.

As shown in FIG. 2A to FIG. 2C, in a state that the peripheral portion of the work 10 is received in the concave portion 253 (step 252), the region 121 is exposed inside the opening 254, whereas in this state, almost all of the region 122 is supported by the step 252 of the frame member 25.

Furthermore, as shown in FIG. 2A, the frame member 25 on which the work 10 is supported is mounted on a leg portion 26. In other words, the frame member 25 on which the work 10 is supported is positioned above the first electrode 3 (that is, between the first electrode 3 and the second electrode 4) by the leg portion 26 so as to be spaced apart from the first electrode 3.

In this way, the work 10 is held with being spaced apart from the first electrode 3 and substantially parallel to the first electrode 3. Further, in this state, the region 121 faces the first electrode 3 through the opening 254. Therefore, in this embodiment, a support unit is constructed from the frame member 25 and the leg portion 26.

In this regard, since in this embodiment the bottom surface 12 of the work 10 does not need to be treated, the bottom surface 12 may be covered with a protection sheet, a film or a mask member (these are not shown) if needed, or may not be covered with them.

However, the region 121 constitutes a part of an external surface of the usable region of the work 10 as well as the region 111. Therefore, it is required to prevent any discharge from occurring at this region 121 in order to avoid degeneration or deterioration at this region 121.

According to such a plasma treatment apparatus 1, there may be a case that discharge occurs between the region 122 and the step 252 or a side surface 13 of the work 10 and the step 252. However, in this embodiment, since a sufficient distance is ensured between the work 10 (usable region) and the first electrode 3, it is possible to prevent occurrence of discharge not only at the region 111 but also at the region 121 of the work 10.

Therefore, the region 111 of the work 10 can be subjected to an excellent plasma treatment reliably, while preventing degeneration or deterioration of the work 10 (especially, usable region).

Further, according to the plasma treatment apparatus 1, even if warpage is present in the work 10, occurrence of discharge at the regions 111 and 121 (that is, usable region) of the work 10 is prevented reliably. Therefore, a work 10 in which warpage would be easily to occur can be also subjected to the good plasma treatment, while preventing occurrence of discharge at the regions 111 and 121 (that is, usable region) of the work 10.

From this point of view, the average thickness of the work 10 is preferably in the range of about 0.01 to 2 mm, and more preferably in the range of about 0.05 to 1 mm. In the case of a thin work 10 having a thickness of the above range, warpage is easily to occur. However, according to the plasma treatment apparatus 1 of this embodiment, such a work 10 can be also subjected to the plasma treatment effectively.

Further, as mentioned above, the frame member 25 supports almost all of the region 122 of the work 10 at the step 252 thereof. This also makes it possible to reliably support a work 10 having a thin thickness and a relatively low mechanical strength by the frame member 25. As a result, it is possible to perform the plasma treatment on such a work 10.

Now, in the plasma treatment apparatus 1 of this embodiment, the support unit, which supports the work 10 in a state that the work 10 is spaced apart from the first electrode 3, is constructed from the frame member 25 and the leg portion 26.

Therefore, by using such a support unit, the work 10 can be conveyed together with the frame member 25 without touching the work 10 directly.

This makes it possible to convey the work 10 easily, while preventing contamination or breakage of the work 10 due to direct contact with an object other than the frame member 25 or an operator who handles the work 10. As a result, it becomes possible to automatically convey the work 10 easily using a conveyance unit which can convey a work (this is not shown).

Further, the frame member 25 has the concave portion 253 (step 252) and can hold the work 10 reliably by receiving the peripheral portion of the work 10 in the concave portion 253. Therefore, even in the case where vibration is given to the frame member 25 during the work 10 being automatically conveyed using the conveyance unit, it becomes difficult for the work 10 to drop therefrom. This helps to convey the work 10 at a high-speed.

In this regard, the concave portion 253 may receive a part of the work 10 in a thickness direction thereof. Even in this case, substantially the same effects can be obtained.

Further, since the frame member 25 holds the work 10 by receiving the peripheral portion thereof in the concave portion 253, it is possible to make a location (position) of the work 10 with respect to the frame member 25 substantially constant at all times.

Therefore, in the case where the work 10 is automatically conveyed using the conveyance unit, positioning of the work 10 is always carried out by positioning the frame member 25. This makes it possible to control the conveyance unit easily. Further, it is also possible to improve positional accuracy of the work 10 with respect to the first electrode 3.

Furthermore, it is preferred that the support unit has a lock unit (lock means) which locks the frame member 25 to a part of the leg portion 26. This makes it possible to carry out positioning of the frame member 25 with respect to the leg portion 26 easily. Further, it is also possible to improve positional accuracy of the work 10 with respect to the first electrode 3

Examples of such a lock unit include a convex portion which is provided on a bottom surface of the frame member 25 and a corresponding concave portion which is provided on an upper surface of the leg portion 26 so as to be engageable with the convex portion.

In this regard, the frame member 25 may be formed from a member having substantially a "U-shape" or "C-shape" when viewed from a top thereof. However, it is preferred that the frame member 25 is formed into a frame having an opening (that is, the frame member 25 is formed to have a hollow square shape without any cutout portion or an annular shape without any cutout portion). This makes it possible to hold the work 10 by the frame member 25 more reliably.

The frame member 25 may be modified so as to be able to hold a plurality of works 10 thereon. For this purpose, the frame member 25 may be configured to have a grid-shaped structure, a comb-shaped structure, a honeycomb structure, or a structure having a plurality of openings.

Each of these structures can have a plurality of spaces or openings, wherein each of the spaces or openings is so shaped and sized that can hold a work 10 and is also formed with a step (concave portion) therearound for receiving a peripheral portion of the work 10 like the step 252 (concave portion 253) of the frame member 25 of the embodiment described above.

According to such a modified frame member, it is possible to hold a plurality of works 10 and to perform a plasma treatment on the works 10 simultaneously.

If occurrence of discharge at the usable region of the work 10 can be prevented, the work 10 may be supported by the frame member 25 at a region of the bottom surface 12 other than the region 122. This also makes it possible to reliably support a large size work 10 in which warpage would be likely to occur.

Since the frame member 25 is supported by the leg portion 26 so as to be spaced apart from the first electrode 3, the distance between the work 10 and the first electrode 3 can be made sufficiently large, even if the frame member 25 is formed to have a thinner thickness.

Namely, by using the leg portion 26, even if such a frame member 25 is used, it is possible to ensure a sufficient distance between the work 10 and the first electrode 3. Therefore, the weight of the frame member 25 can be reduced. As a result, it is possible to easily convey the frame member 25 by the conveyance unit.

In this regard, it is preferred that a height (thickness) of the leg portion 26 can be changed. In other words, it is preferred that the leg portion 26 has a function of adjusting a distance between the frame member 25 and the first electrode 3 by changing the height thereof.

This makes it possible to adjust the distance between the work 10 and the first electrode 3 arbitrarily. The arbitrary adjustment of the distance makes it possible to set the work 10 at an optimum position, depending on conditions and purposes of the plasma treatment.

Although such a frame member 25 may be insulated from the first electrode 3, in this embodiment the frame member 25 is electrically connected to the first electrode 3. This makes it possible for the frame member 25 to have a ground potential.

As a result, it becomes difficult for the frame member 25 to be electrostatically charged. Therefore, it is possible to prevent a behavior of the plasma existing between the work 10 and the second electrode 4 from being influenced by the charged frame member 25. This makes it possible to perform a more uniform and excellent plasma treatment on the work 10.

Examples of a constituent material that can be used for the frame member 25 include various kinds of metal-based materials such as steel, stainless steel, aluminum, copper, titanium and molybdenum, various kinds of ceramics materials such as alumina and zirconia, various kinds of glass materials such as quartz glass and borosilicate glass, and various kinds of composite materials each containing at least two of the above materials.

Among these materials, the constituent material of the frame member 25 is preferably a conductive material and more preferably a metal-based material. By using the conductive material as the constituent material of the frame member 25, conductivity of the frame member 25 can be improved.

This makes it possible to electrically connect the work 10 to the frame member 25 reliably. As a result, since potential difference between the work 10 and the frame member 25 is decreased, it is possible to suppress discharge from occurring therebetween.

Further, in the case where such a metal-based material is used as the conductive material, a mechanical strength of the frame member 25 can be increased. This makes it possible to make a size of the frame member 25 small and reduce a weight of the frame member 25.

Furthermore, since many metal-based materials generally have high durability against various kinds of plasma treatments, degradation of the frame member 25 can be prevented even if it is used for a long time.

Although the work 10 is held at a position spaced apart from the first electrode 3, it is preferred that the distance between the work 10 (especially, usable region) and the first electrode 3 is adjusted, depending on the pressure inside the chamber 2, and the high frequency voltage applied across the first and second electrodes 3 and 4.

Specifically, the distance is preferably in the range of about 10 to 100 mm, and more preferably in the range of about 30 to 60 mm. By setting the distance to the above range, occurrence of discharge between the work 10 (usable region) and the first electrode 3 can be prevented reliably.

In this regard, the distance between the work 10 and the first electrode 3 may be set over the above upper limit values. In this case, however, it is not expected that the effect of preventing occurrence of discharge between the work 10 and the first electrode 3 is further improved. There is also a disadvantage that the size of the plasma treatment apparatus 1 becomes necessarily large.

In this embodiment, the plasma treatment is performed on the work 10 under a vacuum pressure by evacuating the gas inside the chamber 2 using the evacuating pump 7 as described above. This makes it possible to prevent contamination or oxidation of the work 10 due to the contact with the atmosphere. Further, the evacuation of the gas inside the chamber 2 makes it possible to remove reaction products generated during the plasma treatment from the inside of the chamber 2 effectively.

In this regard, it is to be noted that the plasma treatment may be performed on the work 10 under an atmospheric pressure.

Next, description will be made on the function (performance) of the plasma treatment apparatus 1, that is, the plasma treatment method of the invention.

In the case where the plasma treatment is to be performed on the work 10, the work 10 is first placed on the frame member 25 so that the peripheral portion of the work 10 is received in the concave portion 253 of the frame member 25 as shown in FIG. 2A to FIG. 2C. In this state, the frame member 25 is mounted on the leg portion 26 inside the chamber 2. In this way, as shown in FIG. 1, the frame member 25 is supported by the leg portion 26.

Next, the chamber 2 is sealed, and then the inside of the chamber 2 is decompressed by activating the evacuating pump 7. Thereafter, a particular gas is supplied into the chamber 2 by activating the gas supply unit 6. By doing so, the chamber 2 is filled with the supplied gas.

At this time, a high frequency voltage is applied across the electrodes 3 and 4 by driving the power circuit 5. By doing so, a gas molecule contained in the gas existing between the electrodes 3 and 4 is ionized to thereby generate a plasma.

A charged particle and radical contained in the generated plasma make contact with the top surface 11 of the work 10. As a result, the plasma treatment is performed on the top surface 11 due to the action of the charged particle and radical.

For example, in the case where the film forming treatment and the hydrophobic treatment are performed on the top surface 11 (region 111) of the work 10, a film is formed by allowing a component contained in the treatment gas to adhere to the top surface 11 and depositing the component thereon.

Further, the etching process and the ashing treatment are carried out by reacting the charged particle and radical contained in the plasma to a constituent material of the work 10, and removing a reaction product from the work 10.

Furthermore, the hydrophilic treatment is carried out by modifying the top surface 11 by the charged particle and radical contained in the plasma.

In this process, since occurrence of unintended discharge can be prevented at the region 111 of the top surface 11 reliably, an excellent plasma treatment can be performed on that region. Further, since the work 10 can be conveyed together with the frame member 25, it is possible to prevent contamination or breaking of the work 10 due to direct contact with an object other than the frame member 25 with the work 10.

While the plasma treatment apparatus and plasma treatment method in accordance with the invention has been described with reference to the illustrated embodiments, the invention is not limited thereto. Individual components constituting the plasma treatment apparatus may be substituted by other arbitrary ones capable of performing the same functions. Moreover, arbitrary constituent components may be added if necessary.

What is claimed is:

1. A plasma treatment apparatus which performs a plasma treatment on a plate-shaped work, the work having a first region to be subjected to the plasma treatment to produce products or parts and a second region other than the first region, the plasma treatment apparatus comprising:
    a first electrode;
    a second electrode provided so as to face the first electrode via the work so that a space is formed between the second electrode and the work;
    a gas supply unit which supplies a gas into the space;
    a power circuit having a power source which applies a high frequency voltage across the first and second electrodes so that the gas supplied into the space is converted into a plasma; and
    a support unit provided between the first electrode and the work, the support unit including a frame member which is formed from a plate-shaped member having a middle portion and an opening portion formed at the middle portion of the plate-shaped member,
    wherein the frame member has a concave portion for receiving at least a part of the second region of the work, and
    wherein the frame member is spaced apart from the first electrode so that the work is spaced apart from the first electrode in a distance at which discharge does not occur between the first region and the first electrode when the high frequency voltage is applied across the first and second electrodes.

2. The plasma treatment apparatus as claimed in claim 1, wherein the work has a first electrode side surface at the side of the first electrode and a second electrode side surface which is opposite from the first electrode side surface, and the support unit supports almost all of the first electrode side surface corresponding to the second region.

3. The plasma treatment apparatus as claimed in claim 1, wherein the support unit is electrically connected to the first electrode.

4. The plasma treatment apparatus as claimed in claim 1, wherein the frame member has conductivity.

5. The plasma treatment apparatus as claimed in claim 4, wherein the frame member is formed of a metal-based material.

6. The plasma treatment apparatus as claimed in claim 1, wherein the support unit includes a leg portion which supports the frame member so that the frame member is spaced apart from the first electrode.

7. The plasma treatment apparatus as claimed in claim 6, wherein the leg portion is provided for adjusting the distance between the first region of the work and the first electrode by changing a distance between the frame member and the first electrode.

8. The plasma treatment apparatus as claimed in claim 1, wherein the distance between the first region of the work and the first electrode is in the range of 10 to 100 mm.

9. The plasma treatment apparatus as claimed in claim 1, wherein the average thickness of the work is in the range of 0.01 to 2 mm.

10. The plasma treatment apparatus as claimed in claim 1, wherein the first electrode has a size larger than that of the first region of the work and is arranged so as to cover completely the first region when viewed from the first electrode.

11. The plasma treatment apparatus as claimed in claim 1 further comprises a chamber in which the work, the first electrode and the second electrode are housed, and the plasma treatment apparatus further comprises an evacuation unit which evacuates gas inside the chamber.

12. A plasma treatment method for performing a plasma treatment on a work using the plasma treatment apparatus defined by claim 1, the plasma treatment method comprising:
    supporting the work by the support unit;
    placing the work supported by the support unit between the first and second electrodes;
    supplying the gas into the space between the second electrode and the work by means of the gas supply unit;
    converting the gas into the plasma by applying the high frequency voltage across the first and second electrodes by means of the power circuit; and
    performing the plasma treatment on at least a second electrode side surface of the work corresponding to the first region using the converted plasma.

13. The plasma treatment apparatus as claimed in claim 1, wherein the support unit is formed so as not to touch the first electrode.

14. The plasma treatment apparatus as claimed in claim 6, wherein the frame member is demountable from the leg portion.

* * * * *